TRANSISTOR HEARING AID AMPLIFIER

Original Filed Nov. 30, 1955 2 Sheets-Sheet 1

INVENTORS
W.H. GREENBAUM
H.A. PEARSON
F.A. HERRMANN
BY Greene, Pineles & Durr
ATTORNEYS

TRANSISTOR HEARING AID AMPLIFIER

Original Filed Nov. 30, 1955 2 Sheets-Sheet 2

INVENTORS
W. H. GREENBAUM
H. A. PEARSON
F. A. HERRMANN
BY
Greene, Pineles & Durr
ATTORNEYS 3,110,868
TRANSISTOR HEARING AID AMPLIFIER
Harry A. Pearson, Mount Vernon, Frank A. Herrmann, White Plains, and William H. Greenbaum, Elmsford, N.Y., assignors to Sonotone Corporation, Elmsford, N.Y., a corporation of New York
Original application Nov. 30, 1955, Ser. No. 549,947. Divided and this application June 16, 1959, Ser. No. 825,626
4 Claims. (Cl. 330—21)

This invention relates to hearing aids, and more particularly to compact transistor amplifying hearing aids worn on the body of the user. This application is a division of our application Serial No. 549,947 filed November 30, 1955, now abandoned.

Among the objects of the invention are novel transistor hearing aids comprising as essential elements, a microphone, at least one stage of high gain amplification combined with frequency response changing means, a driver stage, and a push-pull output amplifier stage suitably biased for class A—B operation and combined with simple distortion reducing and stabilizing arrangements.

More specifically, the invention relates to a multi-stage audio-frequency transistor amplifier comprising a first transistor having its input side connected to an electromagnetic signal source and its output side connected through a coupling transformer to the input side of the second transistor, with the emitters and collectors of the two transistors connected to a common D.C. supply, and having two capacitors serially connected between the transformer and the second transistor, with a control resistance selectively connectible to at least one of the two capacitors for selectively attenuating the response below the mid-band audio frequencies.

Other objects of the invention include hearing aid amplifiers of the above type operating with high stability and which provide maximum overall gain consistent with high power output and minimum battery power consumption.

Further objects of the invention include hearing aid amplifiers of the above type operating with enhanced stability despite their high gain and compact structure, and providing satisfactory and consistent performance over a wide degree of variations in the characteristics of their components and battery variations due to aging.

Still further objects of the invention comprise such hearing aid amplifiers combined with special frequency response control circuits that maintain high efficiency in the transistor circuit performance and a signal-to-noise ratio with a minimum in the number and size of components.

The foregoing and other objects of the invention will be best understood from the following description of exemplifications thereof, reference being had to the accompanying drawings, wherein.

Figure 1:
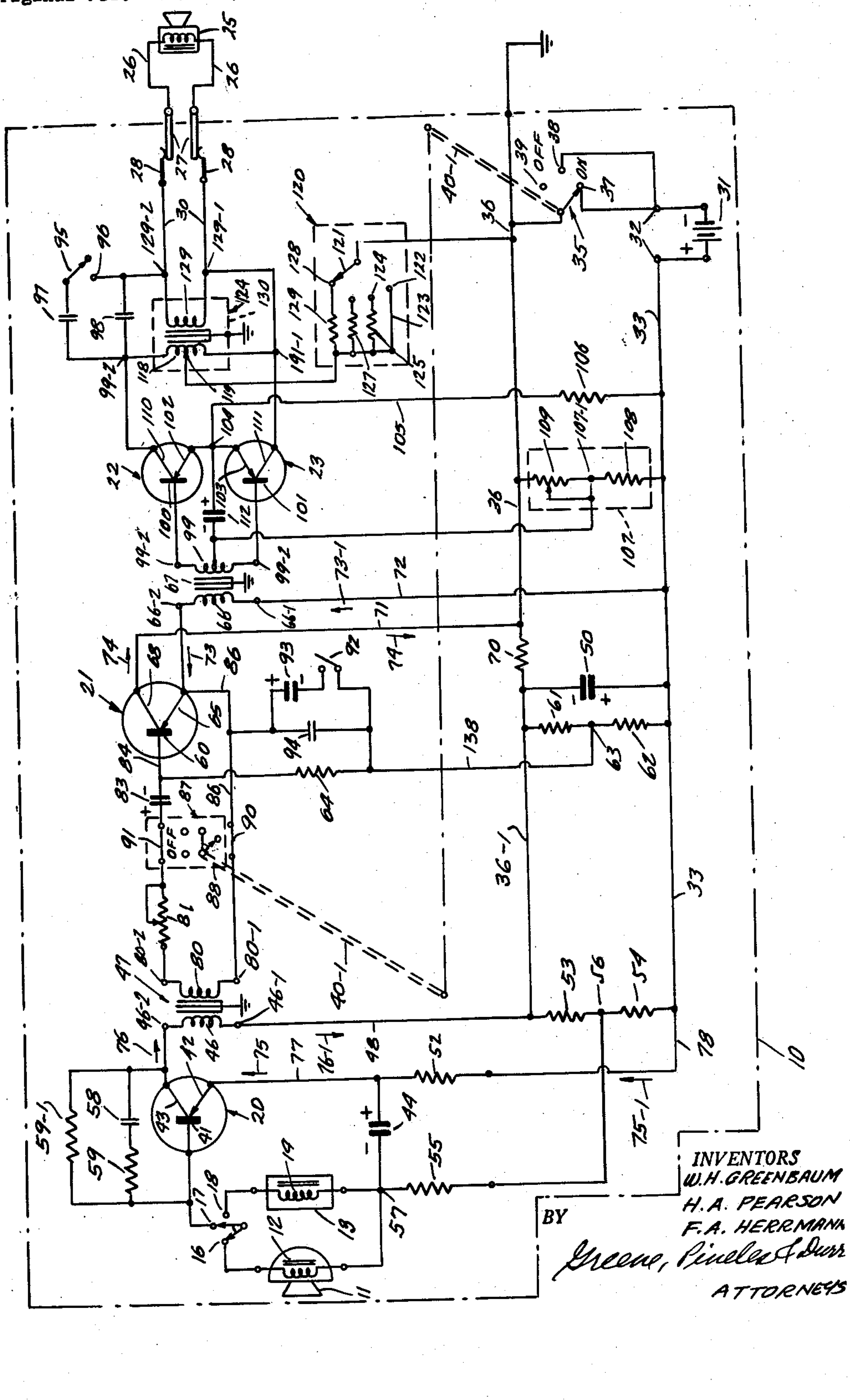
FIG. 1 is a circuit diagram of one practical form of the hearing aid amplifier arrangement exemplifying the invention.

Referring to the electrical circuit diagram of FIG. 1, the dash-dot rectangle 10 represents the case or housing for the amplifier system. The basic dimensions of case 10 are such as to provide a compact enclosure for all the components of the system. The case 10 contains the transducer microphone 11, which is of the electromagnetic type and has magnetic coil 12, which delivers the microphone output. Alternatively, the input side of the amplifier may be connected to magnetic telephone pickup 13 containing electro-magnetic coil element 14. A two-position switch 15 permits the user to connect either hearing aid microphone 11 or telephone pick-up 13 to the input of the transistor amplifier. In the position shown, switch 15, inter-connects at terminals 16, 17 the coil 12 of the microphone 11, to the input of the transistor stage 20. When the switch is moved to either one of the alternative operative position 17, 18, the coil 14 of the magnetic telephone pick-up unit 13 is connected to the transistor amplifier.

The transistor amplifier system of the invention has three amplifier stages, incorporating four transistors 20, 21, 22, 23 which in the arrangement shown are p-n-p transistors. The high gain input stage operates with transistor 20; the driver stage with transistor 22, and the output comprises transistors 22, 23 arranged in balanced push-pull output stage with transistors 22, 23. The output of push-pull transistor stage 22, 23 is at a high signal current level, and is applied to electromagnetic the signal reproducer 25 through a suitable matching transformer 24. The signal reproducer 25, is of the conventional type, and may be an air conduction ear phone or a bone conduction receiver. The leads 26, 26 of reproducer 25 are connected to plug terminals 27, 27 for coaction with jack 28, 28. Jack 28, 28 is mounted in case 10, and connects reproducer 25 to the output of transformer 24 across output leads 30, 30.

A small battery 31 of the "hearing aid type" is insertable in the usual way within the case 10, connectible to battery terminals 32, 32 of the direct current battery supply line 33 of the system. For the sake of simplicity battery lead 33 will be designated battery plus lead and the other lead 36 to which the battery 31 is connected will be designated as battery minus lead, it being understood that the polarity of these leads will be reversed if n-p-n transistors are used in lieu of p-n-p transistors. An on-off supply switch 35 is arranged in series between battery 31 and ground or minus lead 36 of the system. If case 10 is metallic it is connected to ground or grounded. Contacts 37, 38 of supply switch 35 are inter-connected, whereby the "on" connection of the battery for system energization is afforded at both these positions. In the "off" position 39 of switch 35, the amplifier is fully de-energized and inoperative. The on-off switch 35 is ganged to the "bifocal" switch 88 through the schematically indicated linkage 40–1, 40–1.

All the four transistors 20 to 23 are utilized in a common-emitter arrangement, with the inputs into the base of each transistor. The first transistor 20 stage is a low-level, high-gain stage, which has its input signal power delivered to it by magnetic microphone 11 or magnetic telephone pick-up 13. The selector switch 15 permits the user to select either of these sources of signal input. Transistor 20 operates as a common-emitter amplifier. The input signal current flows from microphone 11, or telephone pick-up 13, through the base 41 to emitter 42 of transistor 20, and on through the blocking capacitor 44 back to the microphone 11 or telephone pick-up 13. Such signal path is traversed by the pulsating or alternating current signal components developed by sound and voice signals in transducers 11 or 13.

The output signal current of the first amplification-stage transistor 20 flows from its collector 43 through the primary winding 46 of inter-stage transformer 47, on through leads 48, 36–1 by way of filter capacitor 50, to the battery plus-lead 33, back through the emitter resistor 52 to the emitter 42 of transistor 20. The direct current bias for the base 41 of transistor 20 is provided by the voltage divider resistors 53, 54 which are connected across the direct current potential lines 33 and 36, a current limiting resistor 55 is connected between the tap 56 of the divider resistors 53, 54 and the base 41 of transistor 20, through either microphone 11 or telephone pickup 13 and which is connected to the base 41 through switch 15. A degenerative stabilizing action is provided by the circuit through un-bypassed biasing resistor 52 into the emitter 42 of transistor 20. The degenerative or negative feedback action of emitter resistor 52 in combination with the divider resistors 53, 54, and the bias resistor 55, provides sufficient direct current stability so that standard commercial transistors may be interchangeably inserted at random at 20 in the amplifier system shown, while assuring sufficient direct current stability so that transistors within the range of current gain of three-to-one, in any combination with collector cut-off current up to 10 microamperes at 25° C., and with a battery supply 31, varying from about 1.5 volt to as high as 3.75 volts may be inserted in the circuit and yet maintaining stable operation through temperature changes up in excess of 50° C.

Each transistor amplifier stage uses bias dividers corresponding to 53, 54 and unbypassed series emitter degenerative resistors, corresponding to 52, to provide direct current stabilization equivalent to reducing their direct current alpha from near unity to almost 0.5.

Negative feedback circuit 58, 59 degenerates transistor stage 20 selectively so that the above mid-frequency range is somewhat less amplified, which results in compensation in part for the decrease in the available power from the magnetic microphone 11 in the frequency range below the mid-band frequency.

The second transistor stage 21 of the amplifier system of the invention has a transformer coupled input and transformer coupled output. It has the same built-in direct current stability characteristics as hereinabove described for transistor stage 20. The base 60 current of transistor stage 21 is connected through biasing resistor 64 to center tap 63 of voltage divider 61, 62 which is connected between the battery lines 33, 36–1. The emitter 65 of transistor 21 has for its bias resistance, the direct current resistance of the primary winding 66 of driver transformer 67. The collector of transistor 21 is connected to signal-ground potential lead 36. Low level stages 20 and 21 are de-coupled by an R-C decoupling network insofar as the common impedances of battery 31 circuit are concerned. The R-C decoupling network comprises resistor 70 and condenser 50 which are chosen and arranged to decouple the whole first transistor amplifier stage 20 and the signal input circuit to the second transistor amplifier stage 21, from their common battery impedance of battery 31. Decoupling resistor 70 is connected in series in the ground battery line between line section 36 and the low-level stage battery ground line 36–1. The decoupling capacitor 50, with a value in the exemplary embodiment of 4 microfarads (electrolytic type for minimum size), is connected across battery lines 33 and 36–1.

The output of the second driver stage transistor 21, namely emitter 65 is connected to the next stage load or output, namely, directly to the primary winding 66 of the transformer 67. The collector 68 of transistor 21 is connected directly to the signal ground line 36 by lead 71, and the common-emitter 65 is directly connected to the load, namely to primary winding 66 of the transformer of the driver stage transistor 21. The transistor 21 is not connected as a cathode follower for signal currents, since the signal input connections to its base 60 and emitter 65 differ from such cathode-follower arrangements.

Transistor 21 is utilized as a driver stage of high gain which energizes the driver transformer 67 for high level power gain in the push-pull transistor stage 22, 23. The connection of transistor stage 21 with the common emitter 65, to the output of the transistor stage 20 and to the primary winding of coupling transformer to the power stage, results in the inversion of the phase of the signals flowing from the emitter 65 into the transformer primary winding 66, through the connection 72 to the positive battery lead 33. This makes it possible for the combination thereof with a frequency response control means by selective connection of capacitor 93 to the circuit of the resistance elements 61, 62 through which proper bias current is supplied to the electrode of transistor 21, as explained later.

The second transistor amplifier stage 21 is supplied with input signals from the output winding 80 of inter-stage transformer 47 which is connected in series with rheostat 81 and coupling capacitor 83 between the base 60 and emitter 65 of transistor 21, the rheostat 81 serving as a volume control. The coupling capacitor 83, in the exemplary embodiment, is an electrolytic capacitor of 2 microfarads, and of low voltage type, to serve as a very low impedance coupling for the audio signals.

Volume control 81 is a variable resistor arranged in series with the signal input to second amplifier stage 21. It is thus of the current limiting type, reducing the input signal current to transistor 21 by inserting resistance into the input circuit.

Bifocal frequency control is schematically represented in the input circuit of transistor stage 21 by dotted rectangle 87. The bifocal frequency control 87 is arranged between the secondary winding 80 of interstage transformer 47 and rheostat 81 on one side, and the input 60, 65 of transistor 21 with coupling condenser 83 and lead 86 on the other side. Frequency control switch 87 is shown in FIG. 1 in its "full tone" position, and wherein its dual switch arm 88 is ganged through schematically indicated linkage 40–1, 40–1 to on-off switch 35. It will be noted that the positions of switches 35 and 88 shown correspond to the "on" contact 37 for switch 35, and the "full tone" position for frequency switch 88. Details of exemplary circuitry and operation of the bifocal unit 87 in the transistor amplifier embodiment of FIG. 1 are shown diagrammatically in FIG. 2 and described in detail hereinafter. For the indicated "full tone" frequency switch 88 position, the input and output of the unit 87 is effectively directly linked electrically by connections 90 and 91, wherein no frequency change is effected by the presence of unit 87 in the inter-stage circuit of transistors 20, 21.

In other words, the "full tone" position of the frequency switch 88 affords a direct connection between lead 82 from volume control 81 to the positive terminal of coupling condenser 83; and a direct connection 90 for leads 85 and 86 in emitter 65 path to primary winding 80. Such corresponds to the "full tone" settling of the bifocal or frequency switch 88, which, when linked through 40, 40′ to the battery switch 35, occurs when the hearing aid is on one of its two "on" positions.

Switch 92, shown in its connect position, is used to maintain the relatively large capacitor 93 in circuit across capacitor 94 when no change in frequency range thereby is desired at the input of transistor 21; whereas opening of switch 92 to the position shown in FIG. 2 produces a low frequency cut in transmission of approximately 6 db per octave below mid-band frequency.

Switch 95 which is arranged to effect a high frequency cut in the output signals to signal reproducer 25. When the switch 95 engages contact 96 to shunt capacitor 97 across capacitor 98 such high frequency cut is effected.

Transformer 67 has a center-tapped winding 99 which connects the bases 100, 101 of the respective transistors 22, 23 in 180° out-of-phase relation. In the exemplary system the two emitters 102, 103 of this stage are connected directly together to common point 104 and returned to the positive side of battery 31 through lead 105 and resistor 106 connecting to battery lead 33. The common emitter resistor 106 is unbypassed and creates a direct current degenerative action to extend the usable range of the battery (31) voltage without producing center clipping distortion during amplifier stage 22, 23 action at low voltages, or in the presence of excessive idling current in this stage at the higher voltages. The biasing current for the bases 100, 101 of the transistors 22, 23 is provided from the center tap of a divider 107, comprising a fixed resistor 108 and a semi-adjustable resistor 109.

The resistor 109 is adjusted to provide a biasing current for the transistor push-pull stage 22, 23, wherein the idling current in the collectors 110, 111 is sufficiently large at the lowest usable voltage, to prevent center-clipping or low-level distortion.

An electrolytic capacitor 112 is connected between the common emitter point 104 and the center tap of secondary winding 99 of driver transformer 67, to reduce distortion of the push-pull stage 22, 23 at medium power levels.

The output transformer 24 has its primary winding 118 center-tapped at 119 which point is fed from battery 31 through the four-position power limiting switch unit 120 indicated by a dotted line rectangle. The switch 121 of power selector 120 is connected to the ground point 36, which, when on-off switch 35 is engaged to "on," connects directly to the negative terminal of the battery 31. When selector 121 contacts terminal 122, the direct lead 123, corresponding to a non-resistor position, connects the midpoint 119 directly to ground point 36 and in turn to the collectors 110, 111 of transistor stage 22, 23. This corresponds to the maximum power position with no resistor in series. The next three successive terminals positions 124, 126, 128 selectively place respective resistors 125, 127, 129 between the ground point 36 and the primary winding midpoint 119 for the push-pull collector circuit. The resistors 125, 127 and 129 are arranged to afford successively decreasing power availability to the transistor output in, for example, approximately 3 db steps.

A high frequency cut-off circuit is as follows: Capacitor 98 is permanently interconnected between the input and output windings 118, 29 of output transformer 24 in a manner that they series aid with the primary of the transformer forming an auto-transformer action with the secondary, to present the highest possible impedance to the high frequency cut capacitors 98, 97. The auxiliary capacitor 97 is connectable in parallel across the permanently connected capacitor 98. When the high frequency cut switch 95 is closed on the terminal 96 capacitor 97 is connected in additive capacity relation with capacitor 98 and the feedback interconnection between the transformer 24 sections results in deterioration of the high frequency response beyond that normally encountered with the use of the fixed condenser 98 alone.

Figure 2:
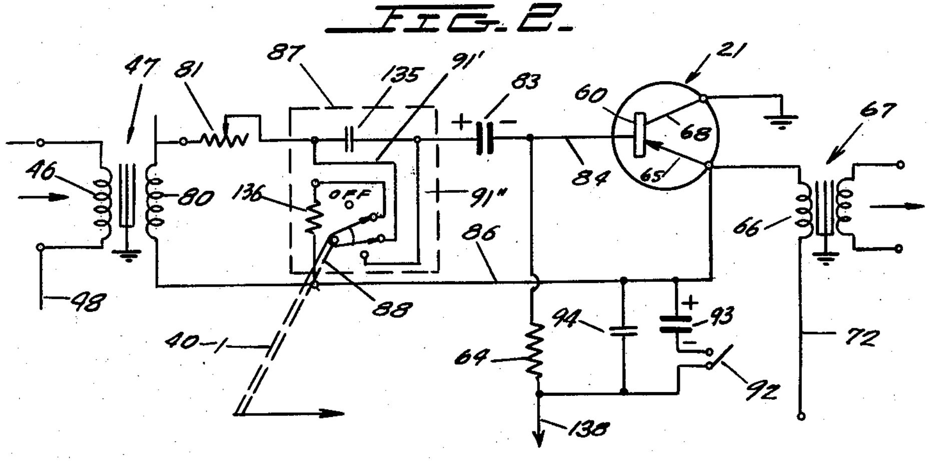
FIG. 2 is a circuit diagram of a section of the amplifier of FIG. 1, incorporating one form of frequency control arrangements exemplifying the invention.
Figure 3:
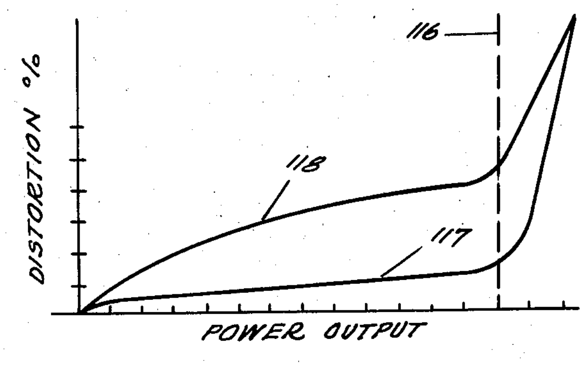
FIG. 3 is a set of curves illustrating the distortion reducing action of the class A—B push-pull amplifier of FIG. 1..

The example of the bifocal tone control represented by rectangle 87 in FIG. 1 and shown diagrammatically in FIG. 2 will now be fully described. It comprises a bifocal selector switch 88, under the control of the user, which is shown in FIG. 2 in its intermediate position, corresponding to the "low frequency cut." This switch 88 is operated in conjunction with on-off switch 35, being shown connected thereto by linkage 40–1. The low frequency cut is arranged so that attenuation of approximately 6 db per octave is effected for frequencies below the mid-band. This feature is accomplished by unit 87 as follows:

With bifocal switch 88 in the central position as illustrated in FIG. 2, a ceramic capacitor 135 is "unshorted" to place it in series between the volume control 81 and the larger electrolytic coupling capacitor 83. The value of the ceramic capacitor 135 in one design was approximately one-fifteenth of the value of the capacity of coupling capacitor 83. In this practical exemplary embodiment, the ceramic capacitor 135 was .04 microfarad, while that of capacitor 83 was a small sized low voltage stable electrolytic capacitor of 2 microfarads capacity.

When the tone control switch 88 (which moves together with the on-off switch 35) is in the full-on position, the circuit elements shown in the box 87 have no effect, and the switch 88 connects only one terminal, such as the arm, of the volume control 81 to coupling capacitor 83 through which it is coupled to the next amplifier stage of transistor 21. When the switch 88 is moved from full-on position to the intermediate low-frequency cut position shown in FIG. 2, a high pass R-C filter section is inserted in the lead from the tone control 88 to the coupling capacitor 83, and connected to the opposite polarity line 86. In the arrangement shown, the R-C filter section consists of capacitor 135 and a resistor 136, and they are proportioned to form with the input resistance of transistor amplifier stage 21 a full pi-section of a high pass filter which provides the desired attenuation of about six db per octave for low-frequency signals, this tone control being independent of the setting of the volume control 81. Furthermore, this tone control arrangement is so connected as to maintain in the circuit a constant impedance source from which the tone control capacitor 135 operates in all settings of the volume control rheostat 81.

The signal output voltage of stage 21 appears between the emitter 65 and signal ground, across output winding 66. A portion of this signal output current flows from the emitter 65 through condenser 94 (and also condenser 93 when in parallel connection therewith), then through lead 138 to the voltage divider 61, 62, in A.C. parallel to A.C. or signal ground (49, 51). It is to be noted that both sides of the battery 31 namely, leads 33, 51, and 49—69, are at A.C. or signal ground.

When condenser 93 is connected in circuit, the signal voltage drop across the condenser combination 93, 94, is negligible substantially for all usable frequencies, because of the very low impedance of shunting condenser 93. Therefore, only a negligible portion of the emitter 65 signal current flows through the base resistor 64 back into the base 60 of transistor 21, but rather, to signal ground. However, when capacitor 93 is open circuited by the switch 92′ position, only the small capacity condenser 94 remains in series with the paralleled resistors 61, 62 and emitter lead 86. Then, the signal current flowing from the emitter 65 to condenser 94 causes a larger voltage to appear across the condenser 94 than when switch 92 was closed, which voltage is frequency selective (increasing below mid-band), and sets up a current through the bias resistor 64 and into the base 60 of transistor 21. The below mid-band frequencies are increased therethrough at a rate of approximately 6 db per octave.

The second amplifier stage of transistor 21 includes a gain or volume control formed by rheostat 81 and two low-frequency cutting or control circuits. With the controls set for full volume and full frequency response, the input signal flows from the secondary of the interstage transformer 47 through blocking capacitor 83 to the base of transistor 21 and back from its emitter to the other end of the secondary winding of the interstage transformer 47.

The input side of this transistor 21 also includes a low-frequency control circuit 87 (FIG. 2) which is operated by the user through movement of the on-and-off switch 35 between its two "on" positions. The low-frequency control or cutting circuit consists of a high pass R-C filter section connected through the leads 84, 86 to the base and emitter of transistor 21, and consisting of a pi-section comprising the series capacitor 135, the shunt resistor 136, the other shunt resistor of the pi-section being formed by the input resistance of the transistor 21. The coupling capacitor 83 has such low impedance as to have no material effect on the frequency response. The resistance 136 of this R-C filter section maintains a constant impedance source for the low cut capacitor 135 thereof, regardless of the setting of the volume control rheostat 81. The input side of the transistor 21 also contains an additional low frequency cut control having control switch 92 which serves to connect or disconnect the capacitance 93 across the capacitance 94 which is connected in series with resistance 64 between the base and emitter of transistor 21. When the additional capacitor 93 is in the circuit, the voltage drop across the two capacitors 93, 94 is very small, because of the very low impedance of capacitor 93 for low frequencies, and as a result, a negligible portion of the signal current flows through the circuit of the base resistor 64 of transistor 21. On disconnecting this capacitor 93 by switch 92 only the small capacitor 94 remains in series with voltage dividing resistors 61, 62. As a result, the signal current develops across capacitor 64 a larger voltage and correspondingly larger current through its transistor circuit thereby increasing its output below the mid-part of the audio frequency range at a rate of about 6 db per octave. The secondary winding of the power-stage driving transformer 67 is tapped and drives the push-pull output transistors 22, 23 so that the signals at their bases are 180° out of phase with each other. The two emitters in the transistors 22, 23 are tied together and return to one side, in the present case, to the positive side of the battery 31, through a low-value resistor 106, so as to give the direct current degenerative action which extends the useable range of the battery voltage before experiencing distortion through center clipping at low battery voltages or excess idling current at high battery voltages.

The bias current for the push-pull output transistors 22, 23 is provided from a tap of the voltage dividing resistors 108, 109 which are connected across the battery 31. The two transistors 22, 23 are selected so that they match within gain groups of two db spread. An electrolytic capacitor 112 is connected between the common emitters and the drive transformer tap and so is chosen as to reduce distortion at medium power level. The output of the power stage with the two transistors 22, 23 is delivered to a receiver 25 through an output transformer 24 having a tapped primary winding which is connected to the collectors of the two transistors 22, 23. The tap of the primary winding of the output transformer 24 is connected through a four-position power-limiting switch 24 to one pole of the battery 31, the other pole of which is connected through resistor 106 to the tied emitters of the two transistors 22, 23. The different positions of the power switch 124 make it possible to change the power available in the hearing aid in four steps of about 3 db each.

To reduce the high frequency harmonics generated when the hearing aid is overdriven, a capacitor 98 is permanently connected across the primary winding of the output transformer 124.

In order to further cut the high frequency response for hard-of-hearing individuals who cannot tolerate them, and for cases which have a more severe loss at low frequencies than at high frequencies, there is provided an additional tone control capacitor 97 which may be selectively connected parallel to capacitor 98. The impedance of the primary winding of the output transformer 124 determines the values of the capacitors 98, 97, which have to be connected for cutting undesirable high frequencies.

Decoupling network 50, 70, decouples the input and output sides of the first gain stage of transistor 20 and the signal input circuit to the second amplifier stage of transistor 21 from the common battery impedance which couples them to the power output stage of transistors 22, 23.

It will be apparent to those skilled in the art that the novel principles of the invention disclosed herein in connection with specific exemplifications thereof will suggest various other modifications and applications of the same. It is accordingly desired that in constructing the breadth of the appended claims, they shall not be limited to the specific exemplifications of the invention described above.

We claim:

1. In a transistor amplifier of a device such as a hearing aid worn on the body of the user, having a plurality of transistor amplifier stages and a battery supply having two supply terminals for energizing said amplifier stages: a first stage having a first transistor, circuit means for connecting an electromagnetic signal source to the input side of said first transistor; a second stage having a second transistor and an interstage coupling transformer having its primary winding connected to the output side of said first transistor and its secondary winding connected to the input side of said second transistor; the emitters of said two transistors being connected to one supply terminal and the collectors of said two transistors being connected to the other supply terminal; said second transistor being connected to said secondary winding through a series circuit section including at least two serially connected capacitors; and control means including at least a portion of said series circuit section and operative to selectively effect predetermined frequency response changes for below the mid-band frequencies of the audio-frequency range; said control means including a control resistance selectively connectible across at least one capacitor of said series circuit section and constituting therewith a filter network operative to stably attenuate the response below said mid-band frequencies.

2. In an amplifier as claimed in claim 1, said control resistance being connectible only across one of said two capacitors having a capacitance of the order of 1/50 of the capacitance of the other of said two capacitors, and the amplifier elements being proportioned such that said control means is operative to effect signal attentuation of the order of 6 db per octave for signals below said mid-band frequencies.

3. In an amplifier as claimed in claim 1, the base and emitter of said second transistor being connected to the secondary winding of said transformer, and a by-pass capacitor selectively connectible between the base and emitter of said second transistor for further controlling the frequency response of said amplifier.

4. In a transistor amplifier of a device such as a hearing aid worn on the body of the user, having a plurality of transistor amplifier stages and a battery supply having two supply terminals for energizing said amplifier stages: a first stage having a first transistor, circuit means for connecting an electromagnetic signal source between the base and emitter of said first transistor; a second stage having a second transistor and an interstage coupling transformer having its primary winding connected to the output side of said first transistor and its secondary winding connected to the input side of said second transistor; the emitters of said two transistors being connected to one supply terminal and the collectors of said two transistors being connected to the other supply terminal; said second transistor being connected to said secondary winding through a series circuit section including at least two serially connected capacitors; and a frequency-selective negative feedback network in series between the collector and base of said first transistor for reducing the high-frequency gain of the amplifier and thereby compensate for frequency response characteristics of said signal source, said feedback network including a resistance and a capacitor serially connected between the base and collector of said first transistor.

References Cited in the file of this patent

UNITED STATES PATENTS

| | | |
|---|---|---|
| 2,113,332 | Morse | Apr. 5, 1938 |
| 2,647,957 | Mallinckrodt | Aug. 4, 1953 |
| 2,709,206 | Ferguson | May 24, 1955 |
| 2,762,873 | Goodrich | Sept. 11, 1956 |
| 2,784,262 | Crow | Mar. 5, 1957 |
| 2,811,590 | Doremus | Oct. 29, 1957 |
| 2,845,497 | Barron | July 29, 1958 |
| 2,866,859 | Stanley | Dec. 30, 1958 |

FOREIGN PATENTS

| | | |
|---|---|---|
| 164,807 | Australia | Aug. 25, 1955 |

OTHER REFERENCES

Langford-Smith: "Radiotron Designer's Handbook," fourth edition, 1952, page 210.

Shea: "Principles of Transistor Circuits," Sept. 1953, pages 349–451.